(12) United States Patent
Ryat

(10) Patent No.: US 10,673,390 B2
(45) Date of Patent: Jun. 2, 2020

(54) CLAMPED OUTPUT AMPLIFIER

(71) Applicant: SEMICONDUCTOR COMPONENTS INDUSTRIES, LLC, Phoenix, AZ (US)

(72) Inventor: Marc Henri Ryat, St Clar de Riviere (FR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/108,344

(22) Filed: Aug. 22, 2018

(65) Prior Publication Data

US 2020/0067464 A1 Feb. 27, 2020

(51) Int. Cl.
*H03F 1/52* (2006.01)
*H03F 1/30* (2006.01)
*H03F 3/30* (2006.01)

(52) U.S. Cl.
CPC ............ *H03F 1/303* (2013.01); *H03F 1/307* (2013.01); *H03F 3/3076* (2013.01)

(58) Field of Classification Search
CPC .............. H03F 1/02; H03F 1/52; H03F 1/523
USPC ..................... 330/9, 298; 327/309
See application file for complete search history.

(56) References Cited

U.S. PATENT DOCUMENTS

| 4,138,615 A | * | 2/1979 | McKinlay ............. H03K 17/28 327/345 |
| 6,870,426 B2 | | 3/2005 | Dashtestani et al. |
| 7,518,348 B1 | | 4/2009 | Kobayashi |
| 7,671,776 B1 | | 3/2010 | Rangan et al. |

* cited by examiner

*Primary Examiner* — Steven J Mottola
(74) *Attorney, Agent, or Firm* — Wash Park IP Ltd.; John T. Kennedy

(57) ABSTRACT

Devices, systems and methods for clamping output voltages of op-amps while minimizing post-clamping recovery delays are described. A circuit, which controls transitions between two operating modes, may include a first comparator for comparing an output voltage with a clamping voltage and outputting a first mode signal, a second comparator for comparing an input voltage with a reference voltage and outputting a second mode signal. A first logic component may receive the mode signals, perform a logical operation, and output a logic signal. A duplex output, based on a value of the logic signal, may output a track signal and an inversely corresponding hold signal, such track and hold signals being used by an op-amp circuit to configure adjusting blocks used to control transients during mode transitions.

19 Claims, 6 Drawing Sheets

CLAMPED OUTPUT AMPLIFIER

TECHNICAL FIELD

The technology described herein generally relates to operational amplifiers. More specifically, the technology described herein generally relates to devices and methods for accurately clamping the output of an operational amplifier.

BACKGROUND

As is commonly known and appreciated, operational amplifier ("op-amp") integrator circuits, such as the circuit 100 shown in FIG. 1A, are often formed with a resistive-capacitive (RC) feedback loop. As shown, such op-amp circuits commonly include an op-amp (A) 101 having a non-inverting (+) input 102, connected to a reference voltage signal source 104 providing a reference voltage signal $V_{REF}$, and an inverting (−) input 106, connected to an RC circuit formed by a resistor 103 having a first resistance R1 connected to an input voltage signal source 108 providing an input voltage signal $V_{IN}$. The inverting input 106 is also connected in parallel with a first capacitor 105 having a first capacitance C1 connected to an output voltage node 110, providing an output voltage signal $V_{OUT}$ of the op-amp 101.

As is commonly known, during operation op-amp circuits will often saturate, resulting in the RC feedback loop being out of regulation. Recovery from saturation often takes time because the op-amps often include a Miller capacitor that requires proper biasing. Further, re-biasing of the capacitor often occurs slowly such that the op-amp circuit 100 itself can be slow to recover. A delay in linear operation of the op-amp 101 commonly arises due to the need for the op-amp 101 to exit clamping and re-bias itself. Re-biasing occurs when the input voltage signal $V_{IN}$ returns to the value of the reference voltage signal $V_{REF}$. The RC time constant formed by first resistance R1 and first capacitance C1 typically dictates the amount of time needed for the op-amp 101 to resume operating linearly. As used herein, the response of an op-amp circuit in recovering from a saturation and/or clamped output situation is determinable in view of the product of the RC time constant. A recovery that is substantially less than the RC time constant is herein defined to be one that is less than percent (20%) of the RC time constant and such a response is further defined herein as being a "quick" response.

As shown in FIG. 1B, one commonly available solution used to attempt to preventing saturation of the op-amp circuit 100 is to use a "clamping" circuit 111, where the output voltage $V_{OUT}$ of the op-amp circuit 111 is clamped at a maximum output voltage. As shown, often a buffer 112 which includes a device AØ is connected to a clamping voltage signal source 114, which provides a clamping voltage signal $V_{CLAMP}$. The buffer 112 is further connected in a maximum limiter configuration to the positive supply voltage terminal 116 for the op-amp 101, with the negative supply voltage terminal 118 being connected to a low voltage potential N, such as a grounded voltage potential. $V_{CLAMP}$ is commonly set at a pre-defined value to prevent the op-amp 101 from being driven to too high or low of an output voltage $V_{OUT}$.

As shown in FIG. 1C, this approach commonly results in a voltage response by the op amp 101 that will incur a delay $t_{delay}$ in decreasing the output voltage $V_{OUT}$ after the designated value for the clamping voltage signal $V_{CLAMP}$ has been reached. This delay arises because, while the output voltage is clamped, the potential at the negative supply voltage N will drift downwards until the next input voltage signal $V_{IN}$ is received. Further, due to the need for the op-amp 101 A to re-bias, by having the negative input supply voltage N equal the reference voltage $V_{REF}$, the delay $t_{delay}$ occurs.

Similarly, other known approaches at preventing saturation of an op-amp integrating circuit by use of clamping or otherwise also suffer from post-clamping recovery delays. Accordingly, a need exists for devices, circuits, and methods which facilitate clamping of output voltages of operational amplifiers, such as operational amplifier integrating circuits, while minimizing post-clamping recovery delays. The various embodiments of the present disclosure satisfy these and other needs.

SUMMARY

The various embodiments of the present disclosure relate in general to devices, systems and methods for minimizing recovery delays of clamp op-amp circuits. In accordance with at least one embodiment of the present disclosure, a clamped, controlled-delay operational amplifier may include a first circuit, which includes an operational amplifier, and a second circuit configured to adjust the first circuit into one of a first operating mode and a second operating mode. For at least one embodiment, the first circuit is configured into one of the two modes based upon results arising from a first comparison of an output voltage of the first circuit with a clamping voltage and a second comparison of an input voltage and a reference voltage.

For at least one embodiment, the first circuit for a clamped, controlled-delay operational amplifier may include an operational amplifier a first switch, a first adjusting block, and a second adjusting block. The first switch may selectively couple and decouple the operational amplifier from each of the first adjusting block and the second adjusting block. Such coupling and/or decoupling may depend on whether a current operating mode is either in the first operating mode, the second operating mode, or a transition mode. For at least one embodiment, the operational amplifier may include a first gain stage, and a second gain stage.

For at least one embodiment, the operational amplifier may include a first switch which may include a first switch having an input node, a first switch track rail, a first switch hold rail. For at least one embodiment, the first switch hold rail may be coupled to a first adjusting block. For at least one embodiment, the first switch track rail may be coupled, via a second node, to each of a second adjusting block and a second gain stage. For at least one embodiment, a second adjusting block may be coupled in parallel with a second gain stage between a second node and a third node of a circuit forming a clamped, controlled delay operational amplifier. For at least one embodiment, a second gain stage may include a Miller compensated amplifier compensated by a second capacitor coupled in parallel with the second gain stage.

For at least one embodiment, a clamped, controlled-delay operational amplifier may include a first switch which couples a first gain stage to a first adjusting block during a first operating mode. The first switch may also couple the first gain stage to a second gain stage during a second operating mode. The first operating mode may include a holding or clamping mode, while the second operating mode may include a tracking or steady-state (e.g., non-saturated) operating mode.

For at least one embodiment, a clamped, controlled-delay operational amplifier may include a second circuit that includes a first comparator configured to compare an output voltage with a clamping voltage. The first comparator may output a first mode signal based upon results of such comparison. Likewise, a clamped, controlled-delay operational amplifier may include a second circuit that may further include a second comparator configured to compare an input voltage with a reference voltage. The second comparator may output a second mode signal based upon results of such comparison.

For at least one embodiment, a clamped, controlled-delay operational amplifier may include a first logic component configured to receive a first mode signal and a second mode signal, perform at least one logical operation, and output a logic signal.

For at least one embodiment, a clamped, controlled-delay operational amplifier may include a duplex output component configured to receive a logic signal and, based on a value of the logic signal, such as whether the value is a positive value or a negative value, output each of a corresponding track signal and an inversely corresponding hold signal. For at least one embodiment, the track signal and the hold signal may have different voltage potentials.

For at least one embodiment, a clamped, controlled-delay operational amplifier may include a control circuit generating a first mode signal when an output voltage of the operational amplifier is greater than or equal to a clamping voltage for the operational amplifier. For at least one embodiment, the mode signal may have a positive value. For at least one embodiment, a clamped, controlled-delay operational amplifier may include a control circuit generating a second mode signal, which may have a positive value, when an input voltage to the operational amplifier is less than a reference voltage.

For at least one embodiment, a clamped, controlled-delay operational amplifier may include a control circuit generating a first logic signal, which may have a negative value, when each of a first mode signal and a second mode signal have a positive value. For at least one embodiment, a second logic signal may have a positive value when at least one of the first mode signal and the second mode signal has a negative value. For at least one embodiment, a duplex output component may be configured to output a positive value which configures the operational amplifier into a second operating mode. For at least one embodiment, a duplex output component may be configured to output a negative value which configures the operational amplifier into a first operating mode.

For at least one embodiment, a clamped, controlled-delay operational amplifier may include a first gain stage and a second gain stage. For at least one embodiment, the second gain stage may generate an output voltage that is provided to a third node. For at least one embodiment, the first gain stage may be selectively coupled, for example, by a first switch and a second node, to the second gain stage. For at least one embodiment, the first switch may be configured to receive at least one of a track signal and a hold signal. For at least one embodiment and based upon receipt of at least one of the track signal and the hold signal, the first switch may selectively couple and decouple the first gain stage with the second gain stage. For at least one embodiment and during a first operating mode, the first gain stage [204] may be decoupled from the second gain stage. For at least one embodiment and during a second operating mode, the first gain stage may be coupled to the second gain stage.

For at least one embodiment, a clamped, controlled-delay operational amplifier may include a first switch having a first switch hold rail. A first adjusting block may be selectively coupled to a first gain stage by the first switch during a first operating mode. For at least one embodiment, a first adjusting block may include a fourth node, coupled to the first switch hold rail, and a third capacitor, coupled between a fourth node and a fourth switch. For at least one embodiment, the fourth node may be coupled to the first switch. The fourth switch may include a fourth switch input node, which may be coupled to the third capacitor, a fourth switch tracking rail, which may be coupled to a reference voltage node providing a reference voltage [$V_{REF}$], and a fourth switch holding rail, which may be coupled to a fifth node. For at least one embodiment, a second switch may include a second switch input node, which may be coupled to the fifth node, a second switch tracking rail, which may be coupled to the fourth node, and a second switch holding rail, which may be coupled to the operational amplifier. For at least one embodiment, a fourth gain stage may include a fourth gain stage input node, which may be coupled to the fourth node; and a fourth gain stage output node, which may be coupled to the fifth node. For at least one embodiment, the second switch may be configured to selectively couple the fourth gain stage to one of the fourth node or the operational amplifier by being respectively pulled to one of the second switch tracking rail and the fourth switch holding rail based upon whether a track signal or a hold signal has a positive value. For at least one embodiment, the fourth switch may be configured to selectively couple the third capacitor to one of the reference voltage node or the fifth node by being respectively pulled to one of the fourth switch tracking rail and the fourth switch holding rail based upon whether the track signal or the hold signal has a positive value.

For at least one embodiment, a clamped, controlled-delay operational amplifier may include a second adjusting block that is coupled to the first gain stage by the first switch and the second node and a second adjusting block that is coupled to the third node and is configured in a parallel configuration with the second gain stage and a second capacitor.

For at least one embodiment, a clamped, controlled-delay operational amplifier may include a second adjusting block that includes a third switch having a third switch input, a third switch tracking rail that may be coupled to ground, and a third switch holding rail that may be coupled to the second node. Further, a third gain stage may be coupled to the second gain stage and to the third switch input. The third switch may be configured to selectively couple the third gain stage to one of ground or to the second node by being respectively pulled to one of a third switch tracking rail and a third switch holding rail based upon values of a track signal and a hold signal, such as whether such values are positive.

For at least one embodiment, a clamped, controlled-delay operational amplifier may include a first gain stage having a non-inverting input node, an inverting input node, that may be coupled to a source of a reference voltage, and an output node, that may be coupled to a first switch. For at least one embodiment, a first circuit may include a first resistor, that may be coupled to the first circuit at a first node and between a source of the input voltage and a non-inverting input node, and a first capacitor that may be coupled to the first node and to a third node.

For at least one embodiment, a clamped, controlled-delay operational amplifier may include a second capacitor. The second capacitor may be a Miller compensating capacitor. For at least one embodiment, an integrating, clamped controlled delay operational amplifier may be formed by an RC circuit formed by a first circuit, a first resistor, and a first capacitor. For at least one embodiment, the controlled delay may arise based upon response times associated with at least one of a first comparator and a second comparator.

For at least one embodiment, a clamped, controlled-delay operational amplifier, at least one of clamping voltage and a reference voltage used thereby may be predetermined.

A control circuit for controlling transitions between a first operating mode and a second operating mode of an operational amplifier circuit may include a first comparator configured to compare an output voltage with a clamping voltage and output a first mode signal. For at least one embodiment, the control circuit may include a second comparator configured to compare an input voltage with a reference voltage and output a second mode signal. For at least one embodiment, the control circuit may include a first logic component configured to receive the first mode signal and the second mode signal, perform at least one logical operation, and output a logic signal. For at least one embodiment, the control circuit may include a duplex output component configured to receive the logic signal and, based on whether the logic signal includes a positive value or a negative value, output each of a corresponding track signal and an inversely corresponding hold signal. For at least one embodiment, the control circuit may include use of a track signal [T] and a hold signal [H] having different voltage potentials.

For at least one embodiment, the control circuit may include use of the track signal and the hold signal, by a first switch, to selectively couple and decouple a first gain stage of an operational amplifier with a second gain stage of the operational amplifier.

For at least one embodiment, the control circuit may include use of the track signal and the hold signal, by a first adjusting block, to provide a quick response by the operational amplifier when transitioning from a clamping mode to a tracking mode.

For at least one embodiment, the control circuit may include use of the track signal and the hold signal, by a second adjusting block to minimize transients arising when the operational amplifier transitions between two different modes of operation. For at least one embodiment, a first of the two different modes of operation is the clamping mode and a second of the two different modes of operation is the tracking mode.

For at least one embodiment of the present disclosure, a method for selectively controlling recovery from clamping of an operational amplifier circuit may include coupling a third capacitor to a reference voltage during a first operating mode; and when the operational amplifier circuit transitions from the first operating mode to the second operating mode, biasing an input voltage for the operational amplifier circuit with the reference voltage by discharging the third capacitor.

For at least one embodiment of the present disclosure, a method for selectively controlling recovery from clamping of an operational amplifier circuit may include use of a third capacitor that arises in a first adjusting block which is selectively coupled to the operational amplifier circuit. For at least one embodiment configured for use with the method for selectively controlling recovery from clamping of an operational amplifier circuit, a first operational amplifier circuit may include a first gain stage. For at least one embodiment of the method, during the first operating mode a first switch may be configured to couple the first gain stage with the third capacitor via a fourth node.

For at least one embodiment, a method for selectively controlling recovery from clamping of an operational amplifier circuit may include use of a first adjusting block that includes a fourth switch. During the method, a third capacitor may be coupled between a fourth node and a fourth switch. For at least one embodiment, the fourth switch may include a fourth switch input node, that may be coupled to the third capacitor, a fourth switch tracking rail, that may be coupled to a reference voltage node providing a reference voltage, and a fourth switch holding rail, that may be coupled to a fifth node.

For at least one embodiment, a method for selectively controlling recovery from clamping of an operational amplifier circuit may include use of a second switch that includes a second switch input node, that may be coupled to a fifth node, a second switch tracking rail, that may be coupled to a fourth node, and a second switch holding rail, that may be coupled to a first circuit.

For at least one embodiment, a method for selectively controlling recovery from clamping of an operational amplifier circuit may include use of a fourth gain stage that includes a fourth gain stage input node, that may be coupled to a fourth node, and a fourth gain stage output node, that may be coupled to a fifth node.

For at least one embodiment, a method for selectively controlling recovery from clamping of an operational amplifier circuit may include use of a second switch configured to selectively couple a fourth gain stage to one of a fourth node or to an operational amplifier by being respectively pulled to one of a second switch tracking rail and a fourth switch holding rail based upon a value and/or polarity of a received track signal [T] or a received hold signal [H]. For at least one embodiment, the selective coupling arises when one of the track signal and the hold signal has a positive value.

For at least one embodiment, a method for selectively controlling recovery from clamping of an operational amplifier circuit may include use of a fourth switch configured to selectively couple a third capacitor to one of a reference voltage node or a fifth node by being respectively pulled to one of a fourth switch tracking rail and a fourth switch holding rail based upon a value and/or polarity of a received track signal [T] or a received hold signal. For at least one embodiment, the selective coupling arises when one of the track signal and the hold signal has a positive value.

BRIEF DESCRIPTION OF THE DRAWINGS

The features, aspects, advantages, functions, modules, and components of the devices, systems and methods provided by the various embodiments of the present disclosure are further disclosed herein regarding at least one of the following descriptions and accompanying drawing figures.

DETAILED DESCRIPTION

The various embodiments described herein are directed to devices, circuits, systems and methods which facilitate clamping of output voltages of operational amplifiers, such as operational amplifier integrating circuits, while minimizing post-clamping recovery delays. The various embodiments of the present disclosure satisfy these and other needs.

Figure 2:
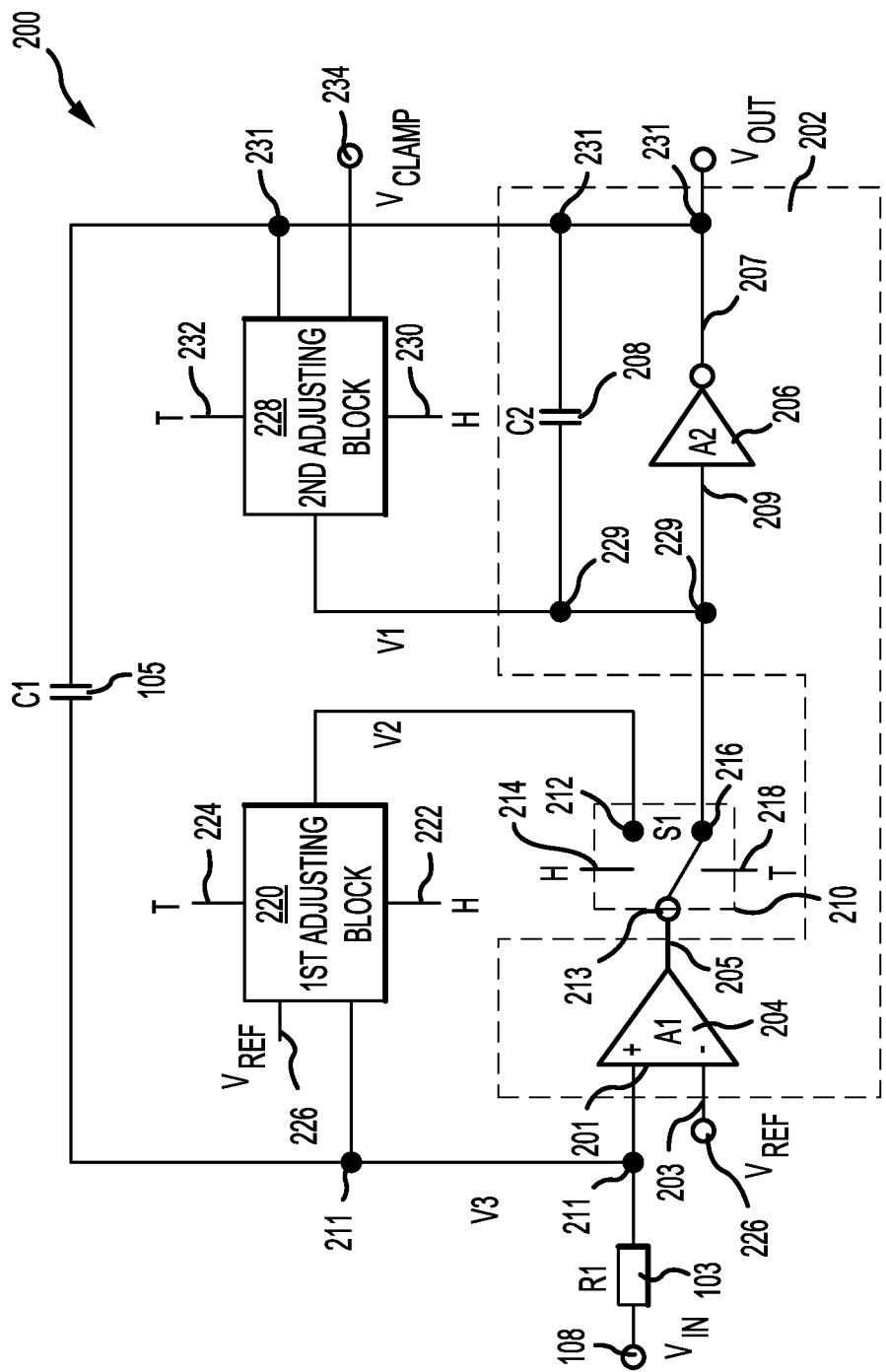
FIG. 2 is a schematic diagram illustrating a first circuit for use in a clamped, controlled delay operational amplifier configured for use in accordance with at least one embodiment of the present disclosure.
Figure 4:
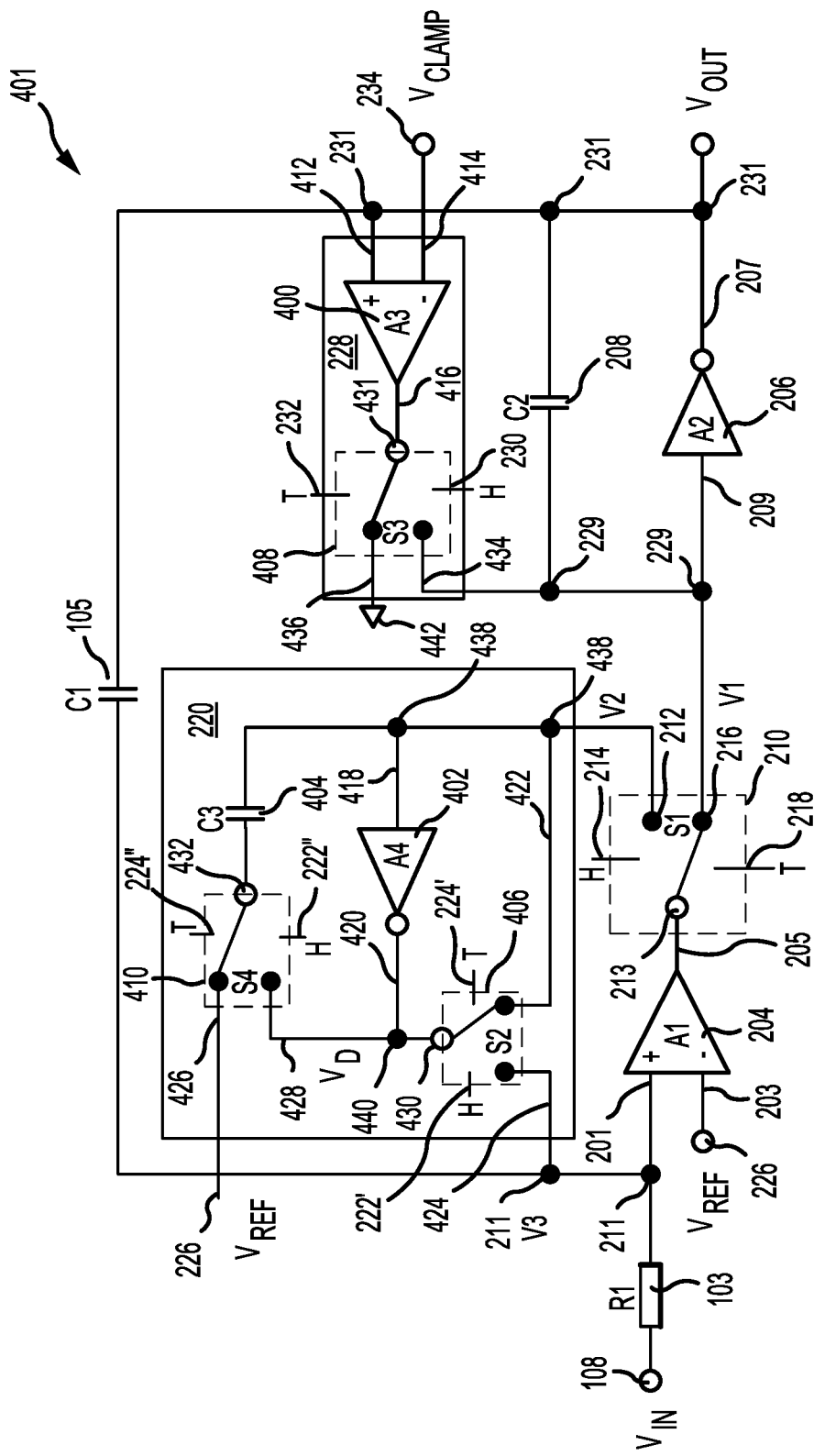
FIG. 4 is a schematic diagram illustrating a third circuit for use in a clamped, controlled delay operational amplifier configured for use operating the first circuit of FIG. 2 in a holding operating mode and in accordance with at least one embodiment of the present disclosure.
Figure 5:
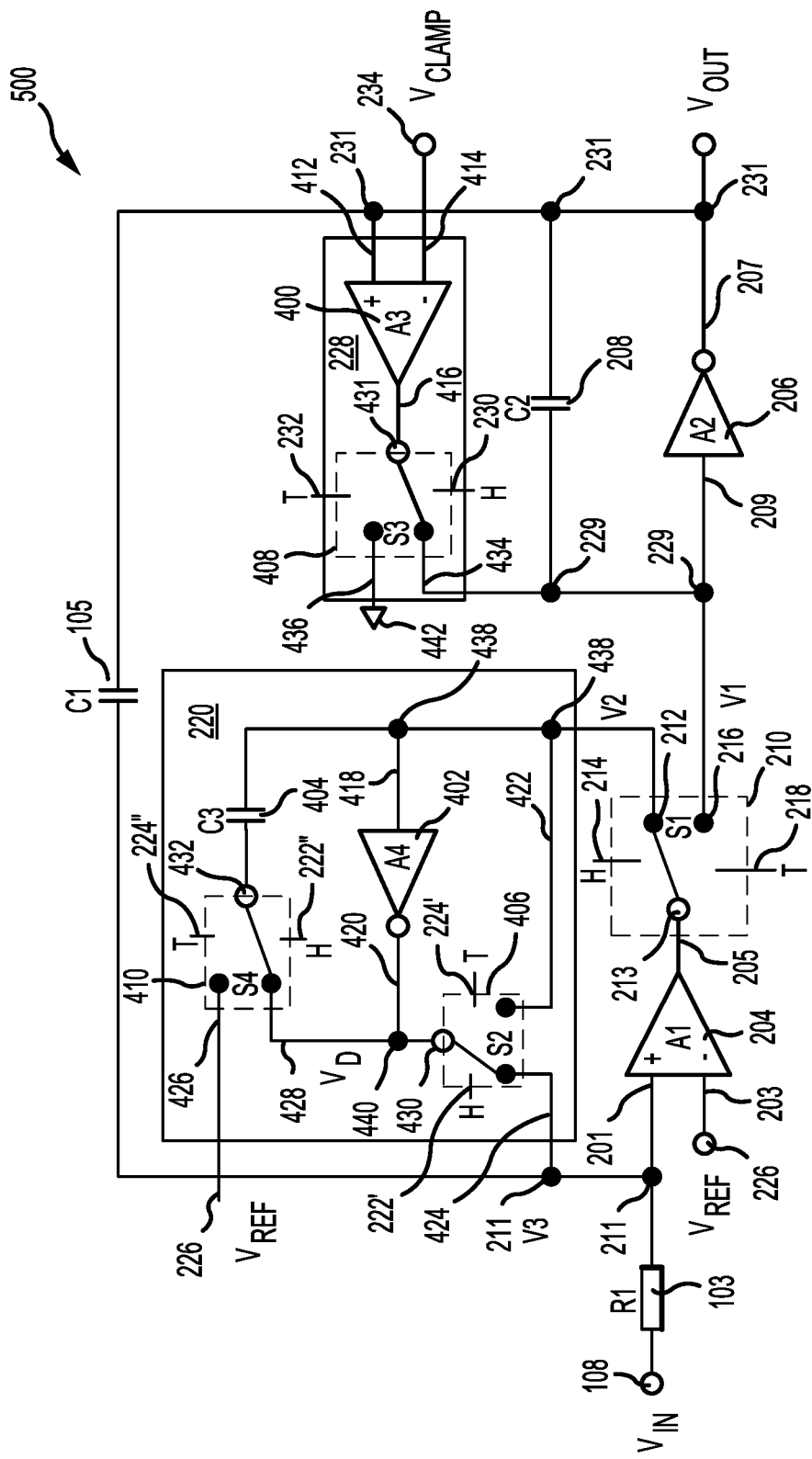
FIG. 5 is a schematic diagram illustrating a fourth circuit for use in a clamped, controlled delay operational amplifier configured for use in operating the first circuit of FIG. 2 in a tracking operating mode and in accordance with at least one embodiment of the present disclosure.

As shown in FIG. 2, a first circuit 200 of an embodiment of a clamped, controlled delay op-amp circuit in accordance with at least one embodiment of the present disclosure which provides for clamping of op-amp output voltages while minimizing post-clamping recovery delays includes an op-amp 202 having a first gain stage 204, a second gain stage 206, and second capacitor 208 having a second capacitance C2. For at least one embodiment, the op-amp 202 is a Miller compensated op-amp where the second capacitor 208 is connected in parallel across a second gain stage input node 209 and a second gain stage output 207. The properties and configurations of Miller compensated op-amps are well-known in the art. For at least one embodiment, the first, second, and to be described below third and fourth gain stages may use operational transconductance amplifiers (OTA's) which are illustrated in FIGS. 2 and 4-5 by the symbols A1, A2, A3 and A4.

The first gain stage 204 is suitably configured to receive the input voltage signal $V_{IN}$ and the reference voltage signal $V_{REF}$ at respective non-inverting node 201 and inverting input node 203. The non-inverting input node 201 is connected to at a first node 211. The first gain stage 204 is also suitably connected to an input voltage source 108 via an RC circuit formed at first node 211 by first resistor 103 and first capacitor 105.

The circuit 200 further includes a first switch (S1) 210 suitably connected between the first gain stage output 205 and the second gain stage input 209. The second gain stage 206 is suitably configured to output, at second gain stage output 207, an output voltage signal $V_{OUT}$.

As further shown, the first switch 210 may be configured, for at least one embodiment, as a double type switch. It is to be appreciated that other types of switches may be used for any of the switches described herein in other embodiments of the present disclosure. A first switch input node 213 is coupled to an output a first gain stage output 205. The first switch 210 couples the first gain stage output 205 to a top rail 212 of the first switch 210 when a hold signal H is present at a first hold node 214 and to a bottom rail 216 of the first switch 210 when a track signal T is present at a first track node 218. As further described below, at any given time only one of the hold signal H or the track signal T is active at any given time. The hold signal H, when active, configures the circuit for a holding mode of operation and the track signal T, when active, configures the circuit for a tracking mode of operation. An active signal may be represented by a positive voltage, a polarity, or otherwise.

The circuit 200 may further include a first adjusting block 220. The first adjusting block 220 is suitably connected to a first switch hold rail 212. As discussed further below, a second internal voltage V2 will arise on the first switch hold rail 212 when the hold signal H is active. The first adjusting block 220 is further configured to receive the hold signal H at second hold node 222, to receive the track signal T at second track node 224, and to receive the reference voltage signal $V_{REF}$ at reference voltage source 226. The first adjusting block 220 is also connected to the first resistor 103 and the first capacitor 105 via the first node 211.

The circuit 200 further includes a second adjusting block 228. The second adjusting block 228 is suitably connected, via a second node 229 and a third node 231, in parallel with the second gain stage 206 and the second capacitor 208. As discussed further below, a first internal voltage $V_1$ will arise at the second node 229 when the first switch 210 is configured into the track position, which it is to be appreciated occurs when the track signal T is active. The second adjusting block 228 is further configured to receive the hold signal H at third hold node 230, to receive the track signal T at third track node 232, and to receive the clamping voltage signal $V_{CLAMP}$ from a clamping source 234.

It is to be appreciated that a first combination of the first gain stage 204 with the first adjusting block 220 and a second combination of the second gain stage 206 with the second adjusting block 228 each adjusting block 220 and 228 acts as a respective voltage buffer. The buffers constrain each of a third internal voltage V3, at the first node 211, and the output voltage $V_{OUT}$, at the third node 231 such that the third internal voltage V3 follows the reference voltage signal $V_{REF}$ and the output voltage signal $V_{OUT}$ follows the clamping voltage signal $V_{CLAMP}$, while providing for the first internal voltage V2 to remain properly biased.

Figure 3:
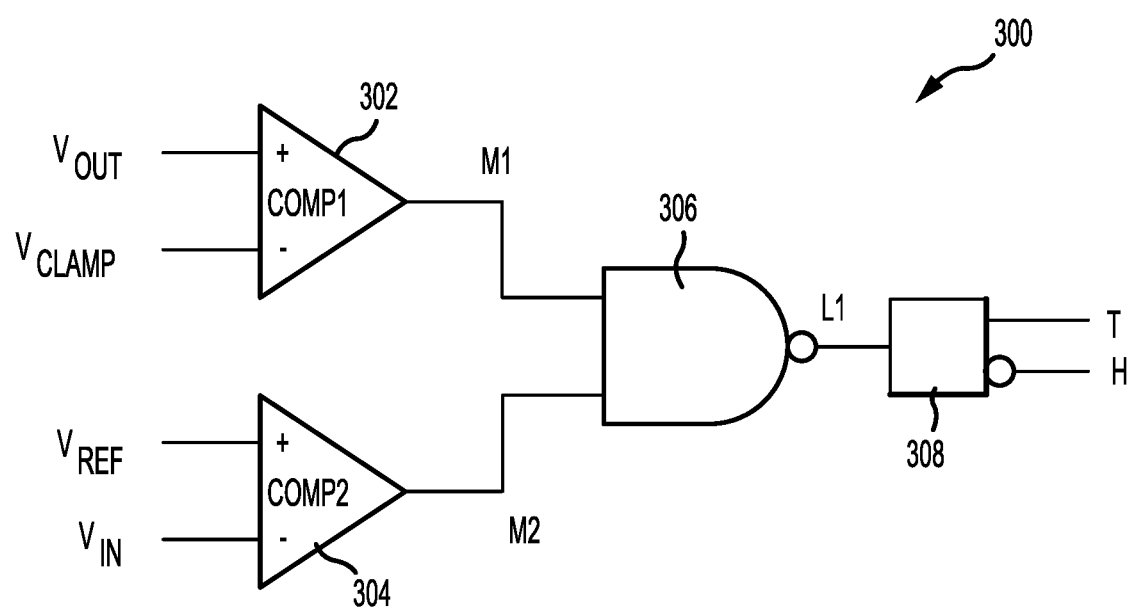
FIG. 3 is a schematic diagram illustrating a second circuit for use in a clamped, controlled delay operational amplifier configured for use in accordance with at least one embodiment of the present disclosure.

As shown in FIG. 3, a second circuit 300 of a clamped, controlled delay op-amp circuit in accordance with at least one embodiment of the present disclosure includes a first comparator ("Comp1") 302, a second comparator ("Comp2") 304, each of which are suitably connected to a first logic component 306, which is connected to a duplex output component 308. In at least one embodiment, the first logic component 306 outputs a signal arising from execution of the desired logical operation, herein designated as logic signal L1. The first logic component 306 may be configured, for at least one embodiment, as a NAND gate. It is to be appreciated, however, that other forms of logic components may be utilized, as desired for any given embodiment of the present disclosure. Further, for at least one embodiment, the duplex output component 308 is a non-overlapping duplex output component which provides two output signals having opposed values (e.g., "high" versus "low", "active" versus "passive", or otherwise).

As further shown in FIG. 3, the first comparator 302 is configured to receive the output voltage signal $V_{OUT}$ and the clamping voltage signal $V_{CLAMP}$. Based upon a comparison of these signals, when the output voltage signal is less than the clamping voltage signal, the first comparator 302 will output a negative (e.g., a value of "0") first mode signal M1; otherwise the first comparator 302 will output a positive (e.g., value of "1") first mode signal M1, wherein a positive first mode signal indicates that output voltage clamping may be needed.

Similarly, the second comparator 304 is configured to receive the reference voltage signal $V_{REF}$ and the input voltage signal $V_{IN}$. Based upon a comparison of these signals, when the input voltage signal $V_{IN}$ is less than the reference voltage signal $V_{REF}$, the second comparator will output a positive (e.g., a value of "1") second mode signal M2. It is to be appreciated that when both the first mode signal M1 and the second mode signal M2 are positive, the second circuit 300 instructs the first circuit 200, via a positive hold signal H to perform clamping of the output voltage $V_{OUT}$.

Further, the first logic component 306 is configured to determine, based upon the values of the first mode signal M1 and the second mode signal M2, whether a first (e.g., high or positive) second (e.g., low or negative) logic signal L1 is to be output. It is to be appreciated that "high"/"positive" and "low"/"negative" or other naming conventions may be used to designate first and second values for the logic signal L1. For at least one embodiment, a high logic signal L1 corresponds to a high track signal T. Further, based on the value of the logic signal L1, a high hold signal H or a high track signal T is to be output by the second circuit 300 to the first circuit 200. As shown in the embodiment of FIG. 3, the hold signal H will be "high" or positive when the inverse of the logical NAND operation outputs a negative result. Contrarily, the track signal T will be "high" or positive when the logical NAND operation outputs a positive result. As shown above with reference to FIG. 2, the track T and hold H signals configure the operation of the first switch 210, and as discussed below with respect to FIGS. 4 and 5, the operation of the first adjusting block 220 and the second adjusting block 228.

As shown in FIG. 4 and FIG. 5 for at least one embodiment of the present disclosure, a tracking mode circuit 401 and a holding mode circuit 500 includes a first adjusting block 220 that is further configured to include a fourth gain stage 402. For at least one embodiment, the fourth gain stage 402 provides an inverted output signal at a fourth gain stage output 420. The first adjusting block 220 may be configured to include a second switch 406 (also identified as "S2"), a third capacitor 404 having a third capacitance C3, and a fourth switch 410 (also identified as "S1").

Each of the second switch 406 and the fourth switch 410 may be double type switches having respective inputs 430 and 432, tracking rails 422 and 426 configured for use in facilitating the tracking mode of operation, and holding rails 424 and 428 configured for use in facilitating the holding mode of operation. A second switch tracking rail 422 may be connected at a fourth node 438 to a first terminal for the third capacitor 404 and a fourth gain stage input node 418. The second switch holding rail 424 may also be connected to the first node 211. The second switch input 430 may be connected to a fourth gain stage output node 420 at a fifth node 440 also connecting the fourth switch holding rail 428. The fourth switch input 432 may be connected to a second terminal for the third capacitor 404. The fourth switch tracking rail 426 may be connected to a reference voltage source 226, at which the reference voltage $V_{REF}$ is provided. The configuration of each of the second switch 406 and the fourth switch 410 is controlled by the opposing hold signal H and track signal T output by the second circuit 300 and which are shown in FIGS. 4 and 5 as being received at respective nodes 222', 222", 224' and 224".

As further shown in FIG. 4 and FIG. 5 for at least one embodiment of the present disclosure, the second adjusting block 228 is further configured to include a third gain stage 400. For at least one embodiment, the third gain stage 400 is configured to receive the output voltage signal $V_{OUT}$, via the third node 231, at a third gain stage non-inverting input 412, and the clamping voltage signal $V_{CLAMP}$ at a third gain stage inverting input 414. A third gain stage output 416 is connected to a third switch input 431. Per at least one embodiment, the third switch 408 is a double type switch configured for operating between the holding mode and the tracking mode based upon which of the hold signal H and the track signal T is active at any given time. The third hold node 230 and the third track node 232 may be respectively configured to receive the hold signal H and track signal T output by the second circuit 300 and thereby configure the third switch 408. The third switch 408 may be configured to include a third switch tracking rail 436 that is suitably grounded, via ground node 442, and a third switch holding rail 434 connected to the second node 229.

The principles of operation for at least one embodiment of the present disclosure and in view of the circuit configurations of FIGS. 2-5 is as follows.

Tracking Mode of Operation

During tracking mode, the first circuit 200, the first adjusting block 220, and the second adjusting block 228 are configured to provide a third circuit 401. As shown in FIG. 4 with respect to the third circuit 401 embodiment, the output voltage signal $V_{OUT}$ is less than the clamping voltage signal $V_{CLAMP}$. This results in the first mode signal M1 having a low value (e.g., zero), which results in the track signal T having a high value (e.g., a one). More specifically, during tracking mode, the first gain stage 204 drives the second gain stage 206 via the first switch 210. Further, the configuring of the second switch 406 and fourth switch 410 onto their respective tracking rails 422 and 426 results in the third gain stage 400 being isolated from the main circuitry. Likewise, the configuring of the third switch 408 onto the third switch tracking rail 436 results in the third gain stage 400 being effectively dumped to ground.

Further, for at least one embodiment, the characteristics of the fourth gain stage 402 are ideally substantially the same as the characteristics of the second gain stage 206. Further, during tracking mode, the third capacitor 404 is charged to a value arising between the reference voltage signal $V_{REF}$ and the second internal voltage V2. It is to be appreciated that the first internal voltage V1 and the second internal voltage V2 will be approximately the same if the fourth gain stage 402 is configured to generate, at the fourth gain stage input node 418, a direct current (DC) operating point similar to the DC operating point generated at the second gain stage input 209. Further, it is to be appreciated that when holding mode is being initiated, the ground node 442 may be desirably biased so as to nearly match the DC operating point at the second gain stage input 209 and such that minimal delay will be encountered when settling the second gain stage 206 with the signals output by the third gain stage 400.

Holding Mode of Operation

During holding mode, the first circuit 200, the first adjusting block 220, and the second adjusting block 228 are configured to provide a fourth circuit 401. As shown in FIG. 5 with respect to the fourth circuit 501 embodiment, the output voltage signal $V_{OUT}$ is greater or equal to the clamping voltage signal $V_{CLAMP}$. Further, the input voltage signal VIN is less than the reference voltage signal VREF. As per FIG. 3, these conditions result in both M1 and M2 having high values and the track signal T having a low value, while the hold signal H has a high value. This results in the switches respectively being configured as per FIG. 5.

More specifically and as shown in FIG. 5, during holding mode of operation the first switch 210 isolates the first gain stage 204 from the second gain stage 206. Further, the third gain stage 400 and the fourth gain stage 402 are now connected to the main circuit. Further, the third capacitor 404 is connected, via the fourth switch 410 to the fifth node 440—which as described above is connected to the fourth gain stage output 420. This configuration results in the third capacitor 404 effectively functioning as a Miller capacitor for the fourth gain stage 402. Further, the fourth gain stage 402 then operates as another (a "second") second gain stage via the arrangement of the first gain stage 204 (A1) and the fourth gain stage 402 (A4). Further, due to the third capacitor 404 having been substantially pre-charged during tracking mode, insignificant and/or minimal disturbance occurs in the third internal voltage V3 arising at the first node 211. It is to be appreciated that the effectively resulting A1-A4 combined amplifier operates, with respect to the first node 211, as a first voltage follower amplifier that is driven by the reference voltage signal $V_{REF}$. Similarly, the configuring of the first switch 210 and the third switch 408 as shown in FIG. 5, effectively results in the second gain stage 206 (A2) and third gain stage 400 (A3) also effectively operating as a second voltage follower amplifier at the second node 229 with the clamping voltage signal $V_{CLAMP}$ acting as a second input voltage signal.

Transition Mode

During a transition mode, the first circuit 200 transitions between a holding mode of operation and a tracking mode of operation. For at least one embodiment, such transition occurs between the fourth/holding mode circuit 501 of FIG. 5 and the third/tracking mode circuit 401 of FIG. 4. Further, it is to be appreciated that per the embodiments show in FIGS. 2, 4 and 5, such a transition occurs when the input voltage signal $V_{IN}$ is greater than the reference voltage signal $V_{REF}$. This condition results, per the second circuit 300 of FIG. 3, in M2 having a low value, which results in the track signal T having a high value and the hold signal H having a low value. It is to be appreciated that since the third gain stage 400 and the fourth gain stage 402, together with the third capacitor 404, are biased during each operating mode so as to minimize any settling transients, the transition between clamping mode and tracking mode may occur so as to provide a quick response—as defined above. Further, it is to be appreciated that when the third gain stage 400 and fourth gain stage 402 are properly biased, which a person of ordinary skill in the art is capable of so accomplishing, the settling time will be primarily dependent upon response times associated with the first comparator 302 and the second comparator 304.

Figure 1B:
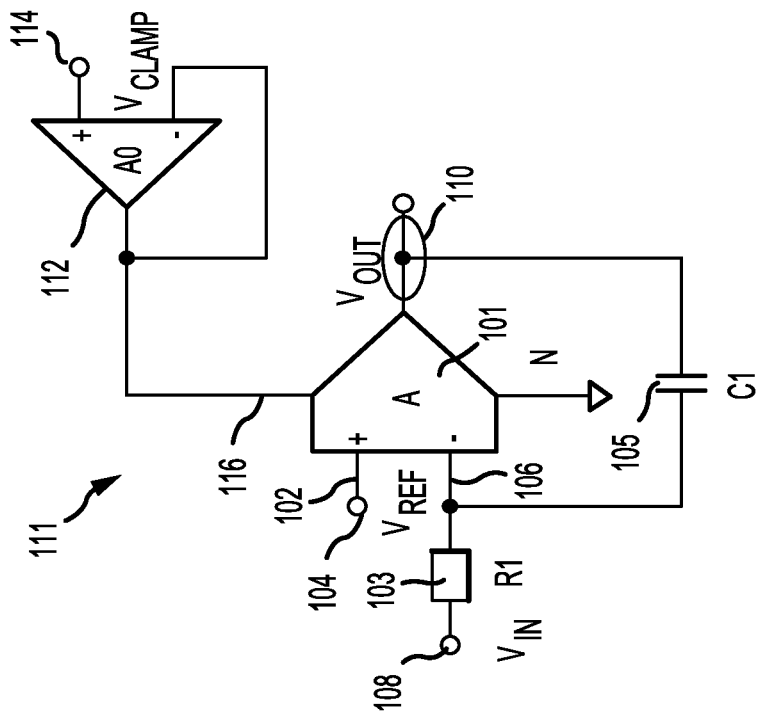
FIG. 1B is a schematic diagram of a prior art clamping integrating operational amplifier circuit.
Figure 1A:
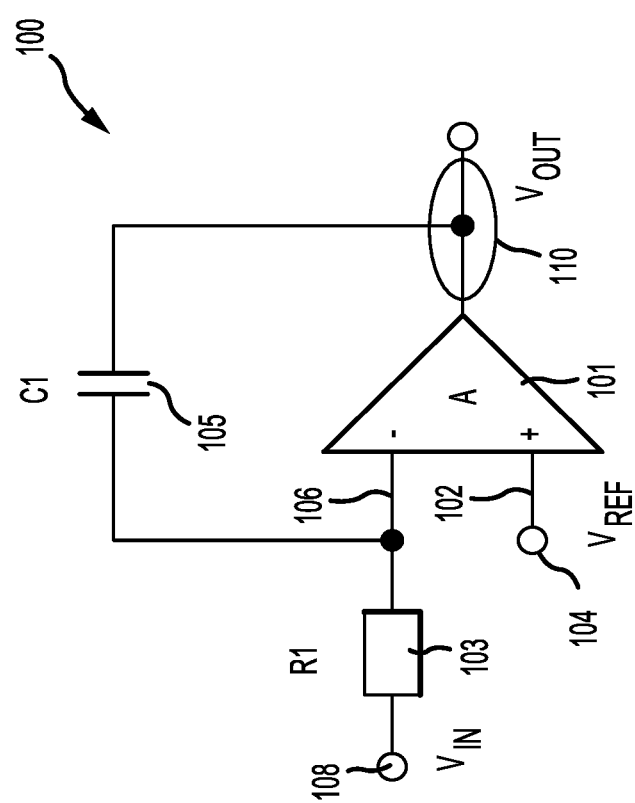
FIG. 1A is a schematic diagram of a prior art integrating operational amplifier circuit.
Figure 1C:
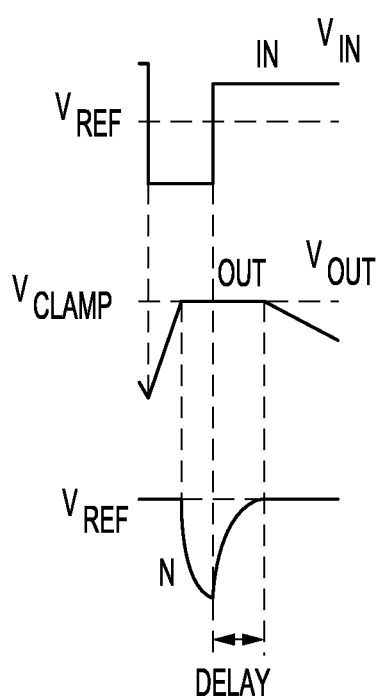
FIG. 1C is a chart illustrating the voltage over time response of the prior art circuit of FIG. 1B.
Figure 6:
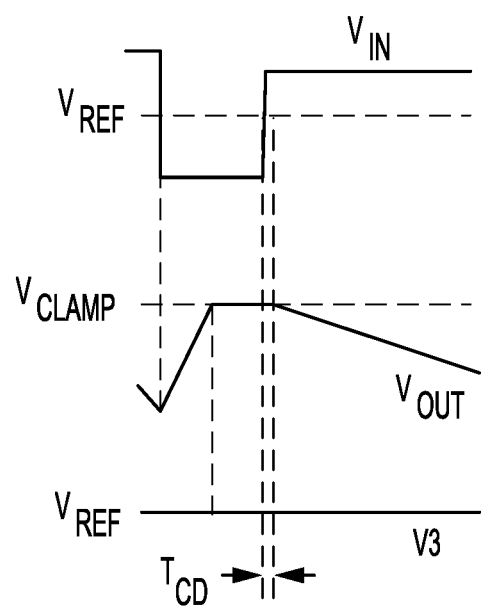
FIG. 6 is a chart illustrating the voltage over time response of a clamped, controlled delay operational amplifier configured in accordance with at least one embodiment of the present disclosure.

In FIG. 6, the operational response of a circuit configured in accordance with at least one embodiment of the present disclosure is shown. As show, comparator delay time $t_{CD}$ determines the amount of delay that arises between a transition from holding mode to tracking mode.

It is to be appreciated that as used herein with respect to at least one embodiment of the present disclosure, the "hold" mode corresponds to a first mode of operation where, for at least one embodiment of the first circuit 200 and/or the fourth/holding mode circuit 501, the output voltage signal $V_{OUT}$ is clamped at the voltage potential specified by the clamping voltage signal $V_{CLAMP}$. Contrarily, the "track" mode corresponds to a second mode of operation wherein for at least the embodiments of the first circuit 200 and/or the third/tracking mode circuit 401, the system operates in a steady-state manner, with the output voltage signal $V_{OUT}$ correspondingly increasing or decreasing based upon the presence or absence of the input voltage signal $V_{IN}$ (while performing for at least one embodiment an integrating function) and the time required for re-biasing of the first gain stage 204 following a clamped mode of operation which is not substantially dependent upon the RC time constant and instead is substantially dependent primarily on any delay arising based upon the operating constraints of the first comparator 302 and/or the second comparator 304 of the second circuit 300.

Although various embodiments of the claimed invention have been described above with a certain degree of particularity, or with reference to one or more individual embodiments, those skilled in the art could make numerous alterations to the disclosed embodiments without departing from the spirit or scope of the claimed invention. The use of the terms "about", "approximately" or "substantially" means that a value of an element has a parameter that is expected to be close to a stated value or position. However, as is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more embodiments of the present disclosure. It is also to be appreciated that the terms "top" and "bottom", "left" and "right", "up" or "down", "first", "second", "before", "after", and other similar terms are used for description and ease of reference purposes only and are not intended to be limiting to any orientation or configuration of any elements or sequences of operations for the various embodiments of the present disclosure. Further, the terms "and" and "or" are not intended to be used in a limiting or expansive nature and cover any possible range of combinations of elements and operations of an embodiment of the present disclosure. Other embodiments are therefore contemplated. It is intended that all matter contained in the above description and shown in the accompanying drawings shall be interpreted as illustrative only of embodiments and not limiting. Changes in detail or structure may be made without departing from the basic elements of the invention as defined in the following claims.

What is claimed is:

1. A clamped, controlled-delay operational amplifier, comprising:
   a first circuit comprising an operational amplifier; and
   a second circuit configured to adjust the first circuit into one of:
      a first operating mode; and
      a second operating mode,
      based upon results of:
         a first comparison of an output voltage of the first circuit with a clamping voltage; and
         a second comparison of an input voltage and a reference voltage;
   wherein the first circuit further comprises:
      an operational amplifier;
      a first switch;
      a first adjusting block; and
      a second adjusting block;
   wherein the first switch selectively couples and decouples the operational amplifier from each of the first adjusting block and the second adjusting block depending on whether a current operating mode is either in the first operating mode, the second operating mode, or a transition mode.

2. The clamped, controlled-delay operational amplifier of claim 1,
   wherein the operational amplifier comprises:
      a first gain stage; and
      a second gain stage.

3. The clamped, controlled-delay operational amplifier of claim 2,
   wherein the first switch comprises:

a first switch input node;
a first switch track rail; and
a first switch hold rail;
wherein the first switch hold rail is coupled to the first adjusting block;
wherein the first switch track rail is coupled, via a second node, to each of the second adjusting block and the second gain stage;
wherein the second adjusting block is coupled in parallel with the second gain stage between the second node and a third node;
wherein the second gain stage is a Miller compensated amplifier compensated by a second capacitor coupled in parallel with the second gain stage.

4. The clamped, controlled-delay operational amplifier of claim 2;
wherein the first switch couples the first gain stage to the first adjusting block during the first operating mode; and
wherein the first switch couples the first gain stage to the second gain stage during the second operating mode.

5. The clamped, controlled-delay operational amplifier of claim 1,
wherein the second circuit comprises:
a first comparator configured to compare the output voltage with the clamping voltage and output a first mode signal;
a second comparator configured to compare the input voltage with the reference voltage and output a second mode signal;
a first logic component configured to receive the first mode signal and the second mode signal, perform at least one logical operation, and output a logic signal; and
a duplex output component configured to receive the logic signal and, based on whether the logic signal includes a positive value or a negative value, output each of a corresponding track signal and an inversely corresponding hold signal;
wherein the track signal and the hold signal have different voltage potentials.

6. The clamped, controlled-delay operational amplifier of claim 5,
wherein the first mode signal has a positive value when the output voltage is greater than or equal to the clamping voltage;
wherein the second mode signal has a positive value when the input voltage is less than the reference voltage;
wherein the logic signal has a negative value when both the first mode signal and the second mode signal have positive values;
wherein the logic signal has a positive value when at least one of the first mode signal and the second mode signal has a negative value;
wherein upon the duplex output component outputting a positive value, the first circuit is configured into the second operating mode; and
wherein upon the duplex output component outputting a negative value, the first circuit is configured into the first operating mode.

7. The clamped, controlled-delay operational amplifier of claim 6,
wherein the operational amplifier comprises:
a first gain stage;
a second gain stage having a second gain stage output at which the output voltage is provided to a third node;
wherein the first gain stage is selectively coupled, by a first switch and a second node, to the second gain stage;
wherein the first switch is configured to receive at least one of the track signal and the hold signal;
wherein based upon receipt of at least one of the track signal and the hold signal the first switch selectively couples and decouples the first gain stage with the second gain stage; and
wherein during the first operating mode, the first gain stage is decoupled from the second gain stage; and
wherein during the second operating mode, the first gain stage is coupled to the second gain stage.

8. The clamped, controlled-delay operational amplifier of claim 7,
wherein the first switch comprises a first switch hold rail;
wherein the first adjusting block is selectively coupled to the first gain stage by the first switch during the first operating mode;
wherein the first adjusting block comprises:
a fourth node coupled to the first switch hold rail;
a third capacitor coupled between a fourth node and a fourth switch;
wherein the fourth node is coupled to the first switch;
wherein the fourth switch comprises:
a fourth switch input node coupled to the third capacitor;
a fourth switch tracking rail coupled to a reference voltage node providing the reference voltage; and
a fourth switch holding rail coupled to a fifth node;
a second switch comprising:
a second switch input node coupled to the fifth node;
a second switch tracking rail coupled to the fourth node; and
a second switch holding rail coupled to the operational amplifier;
a fourth gain stage comprising:
a fourth gain stage input node coupled to the fourth node; and
a fourth gain stage output node coupled to the fifth node;
wherein the second switch selectively couples the fourth gain stage to one of the fourth node or the operational amplifier by being respectively pulled to one of the second switch tracking rail and the fourth switch holding rail based upon whether the track signal or the hold signal has a positive value; and
wherein the fourth switch selectively couples the third capacitor to one of the reference voltage node or the fifth node by being respectively pulled to one of the fourth switch tracking rail and the fourth switch holding rail based upon whether the track signal or the hold signal has a positive value.

9. The clamped, controlled-delay operational amplifier of claim 8,
wherein the second adjusting block is coupled to the first gain stage by the first switch and the second node; and
wherein the second adjusting block is coupled to the third node and in a parallel configuration with the second gain stage and a second capacitor.

10. The clamped, controlled-delay operational amplifier of claim 8,
wherein the second adjusting block comprises:
a third switch comprising:
a third switch input;
a third switch tracking rail coupled to ground; and
a third switch holding rail coupled to the second node; and a third gain stage coupled to the second gain stage and to the third switch input;

wherein the third switch selectively couples the third gain stage to one of ground or to the second node by being respectively pulled to one of the third switch tracking rail and the third switch holding rail based upon whether the track signal or the hold signal has a positive value.

11. The clamped, controlled-delay operational amplifier of claim 10, wherein the first gain stage comprises:
a non-inverting input node;
an inverting input node coupled to a source of the reference voltage; and
an output node coupled to the first switch;
wherein the first circuit further comprises:
a first resistor coupled, at a first node, between a source of the input voltage and the non-inverting input node; and
a first capacitor coupled to the first node and the third node.

12. The clamped, controlled-delay operational amplifier of claim 11, wherein the second capacitor is a Miller compensating capacitor; and
wherein an integrating, clamped controlled delay operational amplifier is formed by an RC circuit formed by the first circuit, the first resistor, and the first capacitor; and
wherein the controlled delay arises based upon response times associated with at least one of the first comparator and the second comparator.

13. The clamped, controlled-delay operational amplifier of claim 11, wherein each of the clamping voltage and the reference voltage are predetermined.

14. A control circuit for controlling transitions between a first operating mode and a second operating mode of an operational amplifier circuit comprising:

a first comparator configured to compare an output voltage with a clamping voltage and output a first mode signal;
a second comparator configured to compare an input voltage with a reference voltage and output a second mode signal;
a first logic component configured to receive the first mode signal and the second mode signal, perform at least one logical operation, and output a logic signal; and
a duplex output component configured to receive the logic signal and, based on whether a value of the logic signal, output each of a corresponding track signal and an inversely corresponding hold signal;
wherein the track signal and the hold signal have different voltage potentials.

15. The control circuit of claim 14, wherein the track signal and the hold signal are used by a first switch to selectively couple and decouple a first gain stage of an operational amplifier with a second gain stage of the operational amplifier.

16. The control circuit of claim 15, wherein the track signal and the hold signal are used by a first adjusting block to provide a quick response by the operational amplifier when transitioning from a clamping mode to a tracking mode.

17. The control circuit of claim 16, wherein the track signal and the hold signal are used by a second adjusting block to minimize transients arising when the operational amplifier transitions between two different modes of operation;
wherein a first of the two different modes of operation is the clamping mode and a second of the two different modes of operation is the tracking mode.

18. A method for selectively controlling recovery from clamping of an operational amplifier circuit, comprising:

electrically coupling a third capacitor to a reference voltage during a first operating mode; and
when the operational amplifier circuit transitions from the first operating mode to the second operating mode, biasing an input voltage continually provided by an input voltage source to an input node for the operational amplifier circuit with the reference voltage by, electrically uncoupling the third capacitor from the reference voltage, electrically coupling the third capacitor to the input node for the operational amplifier circuit, and discharging the third capacitor.

19. The method of claim 18, wherein the third capacitor arises in a first adjusting block selectively coupled to a first operational amplifier circuit;
wherein the first operational amplifier circuit comprises a first gain stage;
wherein during the first operating mode a first switch couples the first gain stage with the third capacitor via a fourth node;
wherein the first adjusting block further comprises:
a fourth switch;
wherein the third capacitor is coupled between the fourth node and the fourth switch;
wherein the fourth switch comprises:
a fourth switch input node coupled to the third capacitor;
a fourth switch tracking rail coupled to a reference voltage node providing the reference voltage; and
a fourth switch holding rail coupled to a fifth node;
a second switch comprising:
a second switch input node coupled to the fifth node;
a second switch tracking rail coupled to the fourth node; and
a second switch holding rail coupled to the first circuit;
a fourth gain stage comprising:
a fourth gain stage input node coupled to the fourth node; and
a fourth gain stage output node coupled to the fifth node;
wherein the second switch selectively couples the fourth gain stage to one of the fourth node or the operational amplifier by being respectively pulled to one of the second switch tracking rail and the fourth switch holding rail based upon whether the track signal or the hold signal has a positive value; and
wherein the fourth switch selectively couples the third capacitor to one of the reference voltage node or the fifth node by being respectively pulled to one of the fourth switch tracking rail and the fourth switch holding rail based upon whether the track signal or the hold signal has a positive value.

\* \* \* \* \*